United States Patent
Kim et al.

(10) Patent No.: US 9,135,961 B2
(45) Date of Patent: Sep. 15, 2015

(54) SEMICONDUCTOR MEMORY APPARATUS, AND REFERENCE VOLTAGE CONTROL CIRCUIT AND INTERNAL VOLTAGE GENERATION CIRCUIT THEREFOR

(71) Applicant: SK hynix Inc., Icheon-si Gyeonggi-do (KR)

(72) Inventors: Cheol Hoe Kim, Icheon-si Gyeonggi-do (KR); Jae Boum Park, Icheon-si Gyeonggi-do (KR); Na Yeon Cho, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 29 days.

(21) Appl. No.: 14/252,087

(22) Filed: Apr. 14, 2014

(65) Prior Publication Data
US 2015/0228311 A1    Aug. 13, 2015

(30) Foreign Application Priority Data
Feb. 10, 2014    (KR) .......................... 10-2014-0014997

(51) Int. Cl.
*G11C 5/14*    (2006.01)
*G05F 3/16*    (2006.01)
*G11C 7/12*    (2006.01)

(52) U.S. Cl.
CPC ........ *G11C 5/147* (2013.01); *G05F 3/16* (2013.01); *G11C 7/12* (2013.01)

(58) Field of Classification Search
CPC ........... G11C 13/0038; G11C 11/4047; G11C 5/148; G11C 11/2297
USPC ..................... 365/226, 227, 189.09
See application file for complete search history.

(56) References Cited

U.S. PATENT DOCUMENTS

2004/0170067 A1*   9/2004   Kashiwazaki ........... 365/189.09
2013/0147545 A1*   6/2013   Kim ........................... 327/541

FOREIGN PATENT DOCUMENTS

KR            100582392 B1        5/2006

* cited by examiner

*Primary Examiner* — Han Yang
(74) *Attorney, Agent, or Firm* — William Park & Associates Ltd.

(57) ABSTRACT

An internal voltage control circuit according to an embodiment may include a source power supply selection unit configured to receive a first internal power supply voltage and a second internal power supply voltage and selecting the first internal power supply voltage and the second internal power supply voltage as a source voltage in response to a test mode enable signal, a first reference voltage generation unit configured to receive the source voltage from the source power supply selection unit, and configured to generate a to first low reference voltage and a first high reference voltage. The reference voltage control circuit may also include a second reference voltage generation unit configured to receive the first internal power supply voltage and configured to generate a second low reference voltage and a second high reference voltage.

19 Claims, 6 Drawing Sheets

SEMICONDUCTOR MEMORY APPARATUS, AND REFERENCE VOLTAGE CONTROL CIRCUIT AND INTERNAL VOLTAGE GENERATION CIRCUIT THEREFOR

CROSS-REFERENCES TO RELATED APPLICATION

The present application claims priority under 35 U.S.C. §119(a) to Korean application number 10-2014-0014997, filed on Feb. 10, 2014, in the Korean Intellectual Property Office, which is incorporated herein by reference in its entirety.

BACKGROUND

1. Technical Field

Various embodiments generally relate to a semiconductor integrated apparatus, and more particularly, to a semiconductor memory apparatus, and a reference voltage control circuit and an internal voltage generation circuit therefore.

2. Related Art

A semiconductor memory apparatus may be divided into a core region which includes a memory cell region and a peripheral region. The semiconductor memory apparatus may be externally supplied with a power supply voltage (VDD) and a ground voltage (VSS). These voltages may be used to generate internal voltages which may be used for the internal operations of the semiconductor memory apparatus.

Internal voltages which may be used for operations of a semiconductor memory apparatus may include, for example among other voltages, a core voltage (VCORE), a high voltage (VPP), a back bias voltage (VBB), a cell plate voltage (VCP), and a bit line precharge voltage (VBLP). The core voltage (VCORE) may be used as an internal power supply voltage which may be supplied to a memory core region.

In general, the cell plate voltage (VCP) and the bit line precharge voltage (VBLP) are generated from the core voltage (VCORE). The cell plate voltage (VCP) may be used as the plate voltage of a cell capacitor. The bit line precharge voltage (VBLP) may be used to precharge a bit line.

However, in a test operation for screening an initial fail of a semiconductor memory apparatus, the core voltage VCORE is supplied at a higher level than would be used in an actual operation of the semiconductor memory apparatus. Thus, when the core voltage VCORE rises, the cell plate voltage VCP and the bit line precharge voltage VBLP rise as well. In this regard, if the cell plate voltage VCP rises in a state in which data of a low voltage level is written in a memory cell, leakage current of a cell capacitor increases.

Due to this fact, while operating in a test operation, a phenomenon may occur whereby a normal cell is over-screened as a fail cell.

SUMMARY

In an embodiment, a reference voltage control circuit of a semiconductor memory apparatus may include a source power supply selection unit configured to receive a first internal power supply voltage and a second internal power supply voltage, and select the first internal power supply voltage or the second internal power supply voltage as a source voltage in response to a test mode enable signal. The reference voltage control circuit may also include a first reference voltage generation unit configured to receive the source voltage from the source power supply selection unit, and configured to generate a first low reference voltage and a first high reference voltage. The reference voltage control circuit may also include a second reference voltage generation unit configured to receive the first internal power supply voltage, and may generate a second low reference voltage and a second high reference voltage.

In an embodiment, an internal voltage generation circuit of a semiconductor memory apparatus may include a first internal voltage driver configured to receive a first low reference voltage and a first high reference voltage, and may be configured to generate a first internal voltage. The reference voltage control circuit may also include a second internal voltage driver configured to receive a second low reference voltage and a second high reference voltage, and may be configured to generate a second internal voltage. Wherein the first low reference voltage and the first high reference voltage may be generated based on either a first internal power supply voltage or a second internal power supply voltage. Wherein the second low reference voltage and the second high reference voltage are generated based on the first internal power supply voltage.

In an embodiment, a semiconductor memory apparatus may include a reference voltage control circuit configured to generate a first low reference voltage and a first high reference voltage based on either a first internal power supply voltage or a second internal power supply voltage, and configured to generate a second low reference voltage and a second high reference voltage based on the first internal power supply voltage. The semiconductor memory apparatus may also include an internal voltage generation circuit configured to generate a first internal voltage after receiving the first low reference voltage and the first high reference voltage, and configured to generate a second internal voltage after receiving the second low reference voltage and the second high reference voltage.

DETAILED DESCRIPTION

Various embodiments and examples of a semiconductor memory apparatus will be described below with reference to the accompanying drawings.

Figure 1:
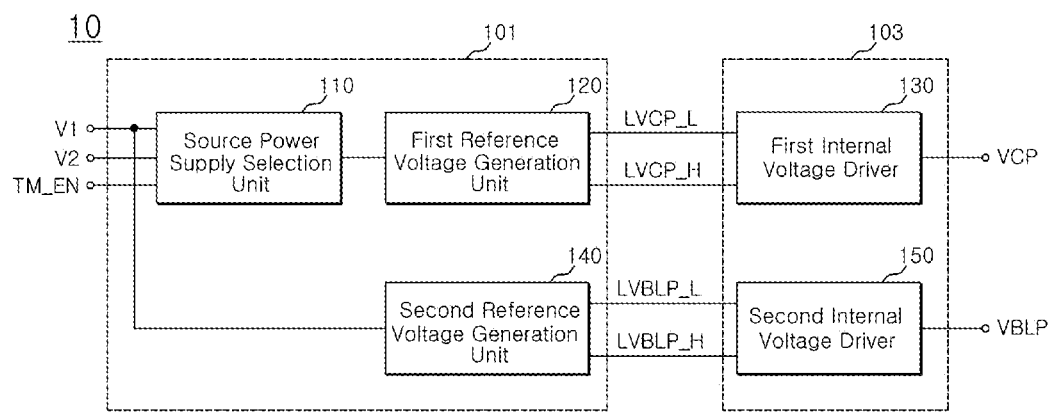
FIG. 1 is a configuration diagram illustrating a representation of a semiconductor memory apparatus including a reference voltage control circuit in accordance with an embodiment.

FIG. 1 is a configuration diagram illustrating examples of representations of a semiconductor memory apparatus including a reference voltage control circuit in accordance with an embodiment.

A semiconductor memory apparatus 10 in accordance with an embodiment may include a reference voltage control circuit 101. The semiconductor memory apparatus 10 may also include an internal voltage generation circuit 103.

The reference voltage control circuit 101 may be configured to include a source power supply selection unit 110, and a first reference voltage generation unit 120. The reference voltage control circuit 101 may also include a second reference voltage generation unit 140.

The source power supply selection unit 110 may be supplied with a first internal power supply voltage V1 and a second internal power supply voltage V2. The source power supply selection unit 110 may be configured to select the first internal power supply voltage V1 or the second internal power supply voltage V2 as a source voltage. This selection may be performed in response to a test mode enable signal TM_EN. The first reference voltage generation unit 120 may receive a source voltage from the source power supply selection unit 110. After receiving this source voltage from source power supply selection unit 110 the first reference voltage generation unit 120 may generate a first low reference voltage LVCP_L and a first high reference voltage LVCP_H from the source voltage. The second reference voltage generation unit 140 may receive a source voltage or as illustrated in FIG. 1 the first internal power supply voltage V1. After receiving this source voltage second reference voltage generation unit 140 may generate a second low reference voltage LVBLP_L and a second high reference voltage LVBLP_H from the source voltage.

The first internal power supply voltage V1 may be a core voltage (VCORE). The second internal power supply voltage V2 may be a fixed power supply voltage (VDL) which has the same voltage level as the core voltage (VCORE) in a normal operation mode. The core voltage (VCORE) is supplied at a higher voltage level in a test mode than when the core voltage (VCORE) is supplied in the normal operation mode. However, the fixed power supply voltage (VDL) is supplied at the same voltage level in the test mode as in the normal operation mode.

Accordingly, when in the test mode, that is, when the test mode enable signal TM_EN is enabled for example, the first low reference voltage LVCP_L and the first high reference voltage LVCP_H are generated using the second internal power supply voltage V2.

The internal voltage generation circuit 103 may include a first internal voltage driver 130 and a second internal voltage driver 150. The first internal voltage driver 130 may generate a first internal voltage, that is for example, a cell plate voltage VCP, in response to the first low reference voltage LVCP_L and the first high reference voltage LVCP_H. The second internal voltage driver 150 may generate a second internal voltage, that is for example, a bit line precharge voltage VBLP, in response to the second low reference voltage LVBLP_L and the second high reference voltage LVBLP_H.

While in the test mode, since the reference voltage control circuit 101 generates the first low reference voltage LVCP_L and the first high reference voltage LVCP_H by using the second internal power supply voltage V2, which retains the same level regardless of an operation mode, the first internal voltage driver 130 may also generate the first internal voltage VCP which has the same level regardless of an operation mode.

Meanwhile, even though the level of the second internal voltage may slightly rise in the test mode, no unwanted performance issues may occur. Accordingly, the second reference voltage generation unit 140 may generate the second low reference voltage LVBLP_L and the second high reference voltage LVBLP_H from the first internal power supply voltage V1 in the test mode. Also, the second internal voltage driver 150 may generate a second internal voltage VBLP by using the second low reference voltage LVBLP_L and the second high reference voltage LVBLP_H.

Figure 2:
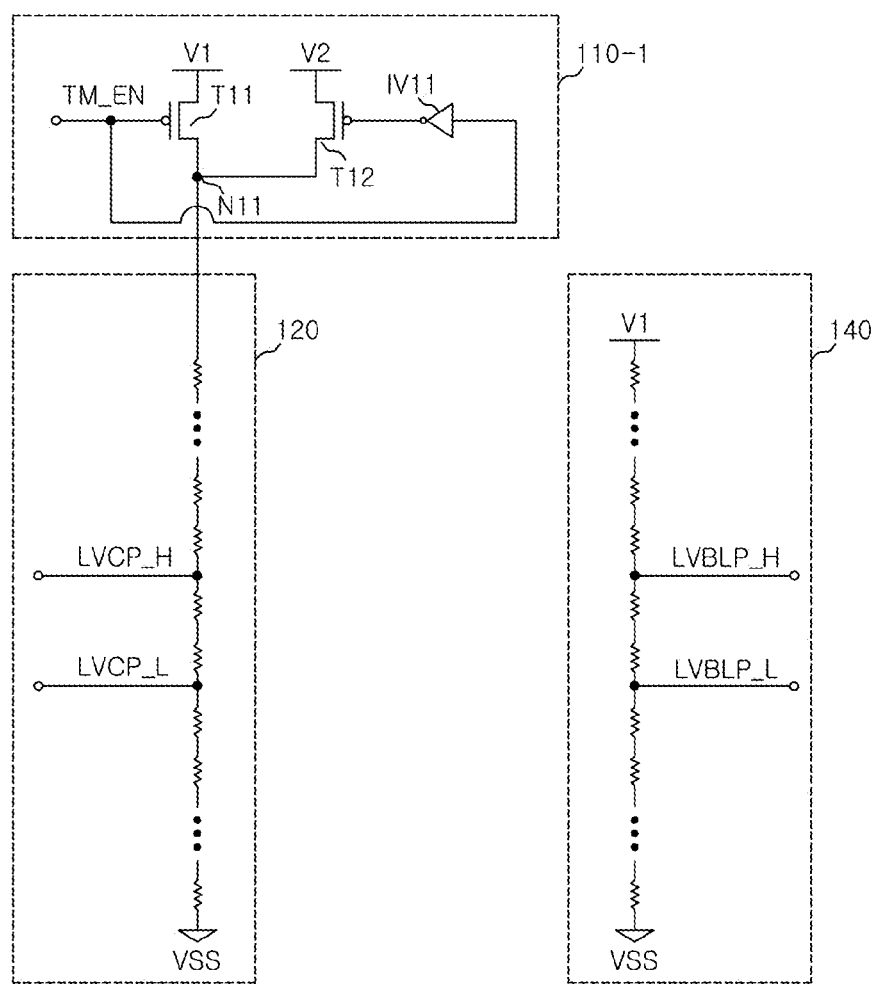
FIG. 2 is a diagram illustrating a representation of an example of an embodiment of the reference voltage control circuit illustrated in FIG. 1.

FIG. 2 is a diagram illustrating a representation of an example of an embodiment of the reference voltage control circuit illustrated in FIG. 1.

A reference voltage control circuit 101-1 illustrated in FIG. 2 may include a source power supply selection unit 110-1, and the first reference voltage generation unit 120. The reference voltage control circuit 101-1 may also include the second reference voltage generation unit 140.

The source power supply selection unit 110-1 may include a first selection element T11 which is driven in response to the test mode enable signal TM_EN and supplies the first internal power supply voltage V1 to an output node N11. The source power supply selection unit 110-1 may also include a second selection element T12 which is driven in response to the test mode enable signal TM_EN inverted by an inversion element IV11 and supplies the second internal power supply voltage V2 to the output node N11.

In the test mode in which, for example, the test mode enable signal TM_EN is enabled to a high level, the first selection element T11 is turned off and the second selection element T12 is turned on. When the first selection element T11 is turned off and the second selection element T12 is turned on the source power supply selection unit 110-1 selects the second internal power supply voltage V2 as the source voltage and supplies it to the output node N11. In the normal operation mode, the test mode enable signal TM_EN may be disabled to a low voltage logic level for example, and the source power supply selection unit 110-1 selects the first internal power supply voltage V1 as the source voltage and supplies it to the output node N11.

The first reference voltage generation unit 120 is electrically coupled between the output terminal of the source power supply selection unit 110-1 and a ground terminal VSS. The first reference voltage generation unit 120 may generate the first low reference voltage LVCP_L and the first high reference voltage LVCP_H. For example, the first reference voltage generation unit 120 may be configured, but not limited to, in the type of a voltage division unit in which a plurality of resistor elements are electrically coupled in series.

In an embodiment, the first low reference voltage LVCP_L may be generated at substantially ⅓ the voltage level of the source voltage, and the first high reference voltage LVCP_H may be generated at substantially ⅔ the voltage level of the source voltage.

The second reference voltage generation unit 140 may be supplied with the first internal power supply voltage V1 and may generate the second low reference voltage LVBLP_L and the second high reference voltage LVBLP_H. The second reference voltage generation unit 140 may be configured, but not limited to, in the type of a voltage division unit in which a plurality of resistor elements are electrically coupled in series between the terminal of the first internal power supply voltage V1 and the ground terminal VSS. In an embodiment, the second low reference voltage LVBLP_L may be generated at substantially ⅓ the voltage level of the first internal power supply voltage V1, and the second high reference voltage LVBLP_H may be generated at ⅔ the voltage level of the first internal power supply voltage V1.

In this way, as the fixed power supply voltage (VDL) is used as the source voltage for generating the cell plate voltage VCP in the test mode, it may be possible to prevent the occurrence of leakage current in a memory cell in which data of a low level is written, thereby preventing over-screening.

Also, while in the test mode, as the bit line precharge voltage VBLP is generated using the core voltage (VCORE), it may be possible to increase a read margin of a memory cell in which data of a high level is written.

Figure 3:
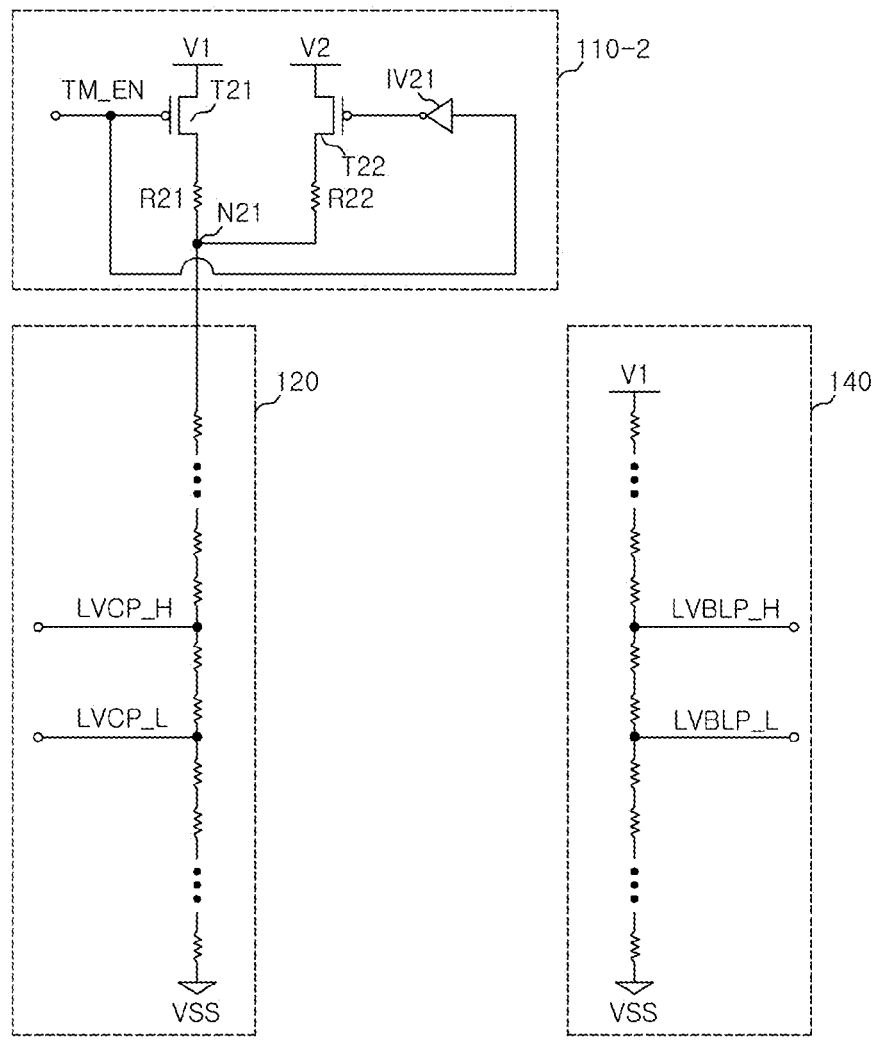
FIG. 3 is a diagram illustrating a representation of an example of an embodiment of the reference voltage control circuit illustrated in FIG. 1.

FIG. 3 is a diagram illustrating a representation of an example of an embodiment of the reference voltage control circuit illustrated in FIG. 1.

A reference voltage control circuit 101-2 in accordance with an example of an embodiment may include a source power supply selection unit 110-2, the first reference voltage generation unit 120, and the second reference voltage generation unit 140. The configurations of the first and second reference voltage generation units 120 and 140 are substantially the same as illustrated in FIG. 2.

The source power supply selection unit 110-2 may include a first selection element T21 which is driven in response to the test mode enable signal TM_EN and supplies the first internal power supply voltage V1 to an output node N21. The source power supply selection unit 110-2 may include a first level control section R21 which is electrically coupled between the first selection element T21 and the output node N21. The source power supply selection unit 110-2 may include a second selection element T22 which is driven in response to the test mode enable signal TM_EN inverted by an inversion element IV21 and supplies the second internal power supply voltage V2 to the output node N21. The source power supply selection unit 110-2 may include a second level control section R22 which is electrically coupled between the second selection element T22 and the output node N21.

The first level control section R21 and the second level control section R22 may be resistor elements which have preset resistance values, respectively.

Particularly, the resistance values of the first level control section R21 and the second level control section R22 may be determined such that a resistance value that is determined by the second selection element T22 and the second level control section R22 when the test mode enable signal TM_EN is enabled may become the same or substantially the same as a resistance value that is determined by the first selection element T21 and the first level control section R21 when the test mode enable signal TM_EN is disabled.

Accordingly, when the level of the core voltage (VCORE) is higher than the level of the fixed power supply voltage (VDL), the resistance value of the first level control section R21 is set to be relatively high, and the resistance value of the second level control section R22 is set to a substantially negligible value. Then, it is possible to control the potential voltage level of the output node N21 to be the same or substantially the same when the test mode enable signal TM_EN is enabled and disabled.

Conversely, when the level of the fixed power supply voltage (VDL) is higher than the level of the core voltage (VCORE), the resistance value of the second level control section R22 is set to be relatively high, and the resistance value of the first level control section R21 is set to a substantially negligible value. Then, it is possible to control the potential voltage level of the output node N21 to be the same or substantially the same when the test mode enable signal TM_EN is enabled and disabled.

Figure 4:
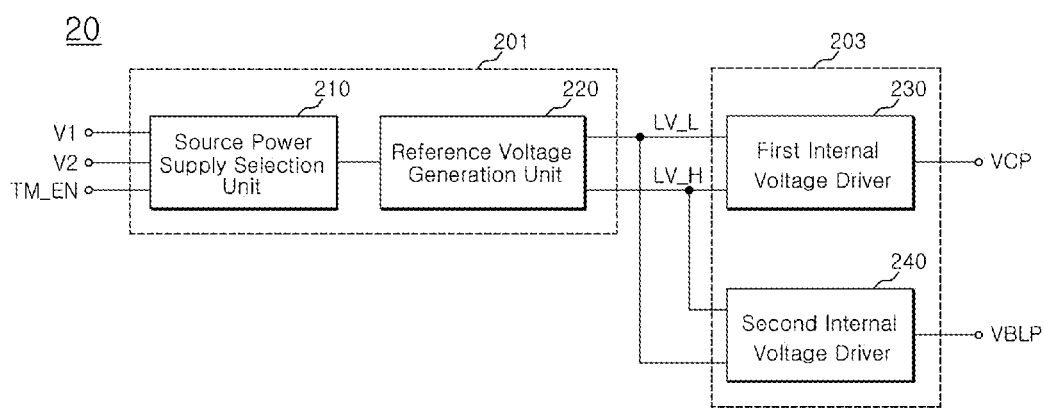
FIG. 4 is a configuration diagram illustrating a representation of a semiconductor memory apparatus including a reference voltage control circuit in accordance with an embodiment.

FIG. 4 is a configuration diagram illustrating a representation of a semiconductor memory apparatus including a reference voltage control circuit in accordance with an embodiment.

A semiconductor memory apparatus 20 in accordance with an embodiment may include a reference voltage control circuit 201 and an internal voltage generation circuit 203.

The reference voltage control circuit 201 may include a source power supply selection unit 210 which may be supplied with a first internal power supply voltage V1 and a second internal power supply voltage V2. The source power supply selection unit 210 may select the first internal power supply voltage V1 or the second internal power supply voltage V2 as a source voltage in response to a test mode enable signal TM_EN. The reference voltage control circuit 201 may also include a reference voltage generation unit 220 which may generate a low reference voltage LV_L and a high reference voltage LV_H in response to the source voltage selected in the source power supply selection unit 210.

The internal voltage generation circuit 203 may include a first internal voltage driver 230 which may be supplied with the low reference voltage LV_L and the high reference voltage LV_H. The first internal voltage driver 230 may generate a first internal voltage VCP. The internal voltage generation circuit 203 may include a second internal voltage driver 240 which is supplied with the low reference voltage LV_L and the high reference voltage LV_H and may generate a second internal voltage VBLP.

The first internal voltage VCP may be a cell plate voltage VCP and the second internal voltage VBLP may be a bit line precharge voltage VBLP.

Figure 5:
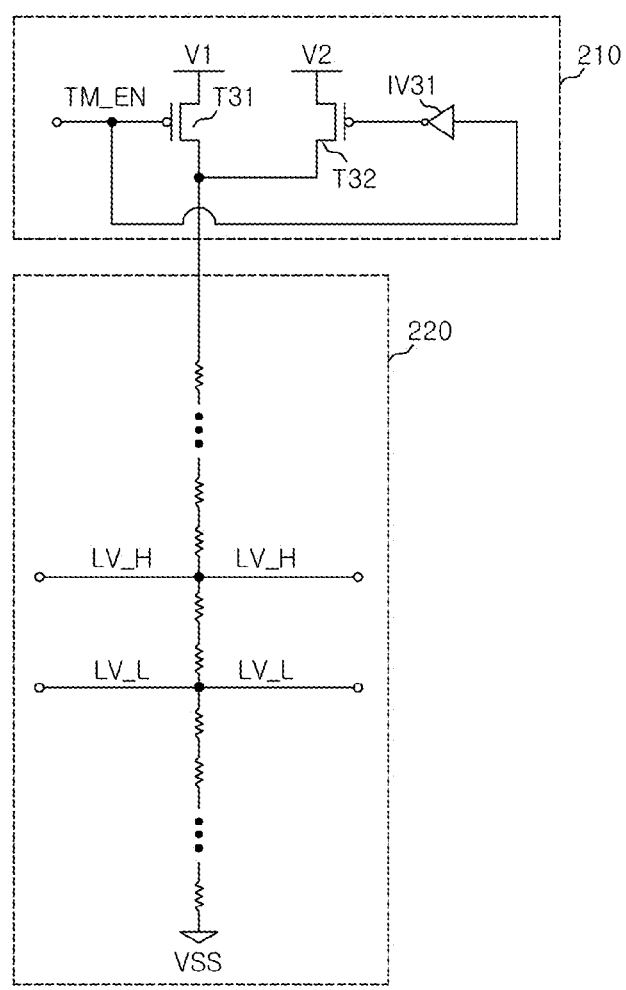
FIG. 5 is a diagram illustrating a representation of an example of an embodiment of the reference voltage control circuit illustrated in FIG. 4.

FIG. 5 is a diagram illustrating a representation of an example of an embodiment of the reference voltage control circuit illustrated in FIG. 4.

As illustrated in FIG. 5, a reference voltage control circuit 201-1 may include the source power supply selection unit 210 and the reference voltage generation unit 220.

The source power supply selection unit 210 may include a first selection element T31 which is driven in response to the test mode enable signal TM_EN and supplies the first internal power supply voltage V1. The source power supply selection unit 210 may include a second selection element T32 which is driven in response to a test mode enable signal TM_EN inverted by an inversion element IV31 and supplies the second internal power supply voltage V2.

The first internal power supply voltage V1 or the second internal power supply voltage V2 which is selected in the source power supply selection unit 210 is supplied to the reference voltage generation unit 220. The reference voltage generation unit 220 generates the low reference voltage LV_L and the high reference voltage LV_H from the source voltage which is provided from the source power supply selection unit 210.

The first internal power supply voltage V1 may be a core voltage (VCORE). The second internal power supply voltage V2 may be a fixed power supply voltage (VDL) which may have the same voltage level as the core voltage (VCORE) in a normal operation mode. The core voltage (VCORE) is supplied at high voltage level in a test mode when compared to the normal operation mode. However, the fixed power supply voltage (VDL) is supplied at the same voltage level in the test mode and in the normal operation mode.

Accordingly, while in the test mode, when the test mode enable signal TM_EN is enabled, the low reference voltage LV_L and the high reference voltage LV_H are generated using the second internal power supply voltage V2, and it is possible to generate an internal voltage of a stable level regardless of a variation in the level of the core voltage (VCORE).

Figure 6:
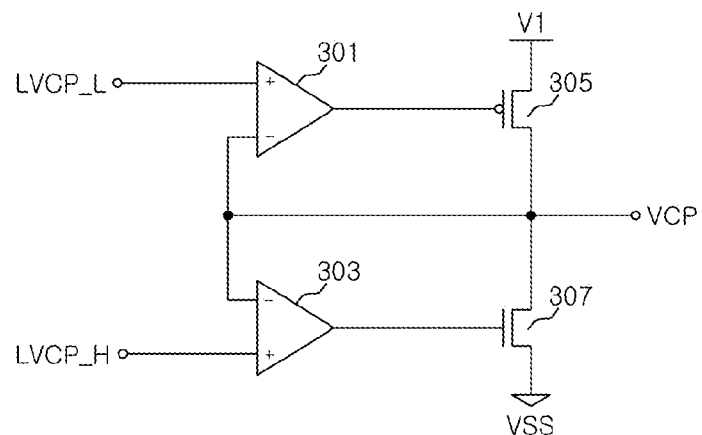
FIG. 6 is a diagram illustrating a representation of an example of an embodiment of an internal voltage driver.

FIG. 6 is a diagram illustrating a representation of an example of an embodiment of an internal voltage driver, in particular, an internal voltage driver which may be applied to the first internal voltage driver 130 illustrated in FIG. 1.

An internal voltage driver 30 may include an NMOS differential amplifier 301 which compares the first low reference voltage LVCP_L and the first internal voltage VCP and raises a voltage up to the level of the low reference voltage LVCP_L by operating a PMOS driver 305 when the level of the first internal voltage VCP is lower than the level of the first low reference voltage LVCP_L. The internal voltage driver 30 may include a PMOS differential amplifier 303 which compares the first high reference voltage LVCP_H and the first internal voltage VCP and lowers a voltage down to the level of the first high reference voltage LVCP_H by operating an NMOS driver 307 when the level of the first internal voltage VCP is higher than the level of the first high reference voltage LVCP_H.

The internal voltage driver 30 illustrated in FIG. 6 may also be applied to the second internal voltage driver 150 illustrated in FIG. 1. In this case, as a matter of course, the second low reference voltage LVBLP_L and the second high reference voltage LVBLP_H should be used as a reference voltage, and the second internal voltage VBLP should be applied as an internal voltage.

As is apparent from the above descriptions, since a cell plate voltage may be generated to the same voltage level even in a test mode as in a normal operation mode, it may be possible to prevent a to normal cell written with data of a low voltage level from being over-screened. Also, since a bit line precharge voltage is generated depending on a core voltage in the test mode, it may be possible to secure a read margin of a cell written with data of a high level.

Figure 7:
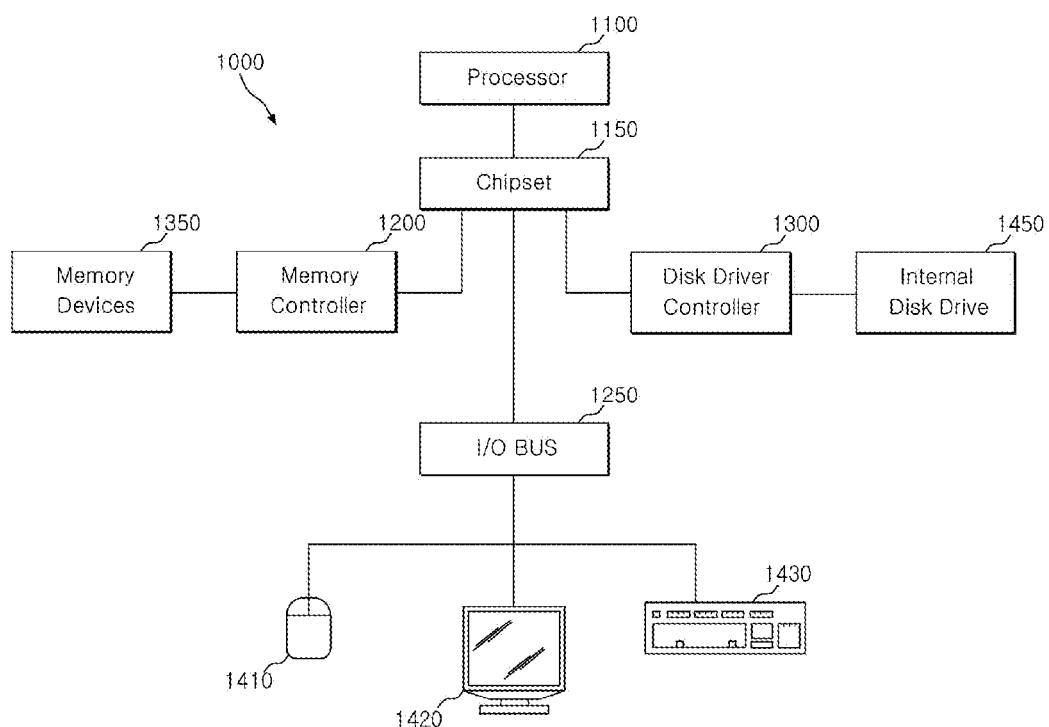
FIG. 7 illustrates a block diagram representation of a system employing the semiconductor memory apparatus in accordance with the embodiments discussed above with relation to FIGS. 1-6.

The semiconductor memory apparatus discussed above is particular useful in the design of memory devices, processors, and computer systems. For example, referring to FIG. 7, a block diagram of a system employing the semiconductor memory apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus as discussed above with reference to FIGS. 1-6. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor memory apparatus as discussed above with relation to FIGS. 1-6, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 7 is merely one example of a system employing the semiconductor memory apparatus as discussed above with relation to FIGS. 1-6. In alternate embodiments, such as cellular phones or digital cameras, the components may differ from the embodiments shown in FIG. 7.

While various embodiments have been described above, it will be understood to those skilled in the art that the embodiments described are by way of example only. Accordingly, the semiconductor memory apparatuses, and the reference voltage control circuits and the internal voltage generation circuits therefore described herein should not be limited based on the described embodiments. Rather, the semiconductor memory apparatuses, and the reference voltage control circuits and the internal voltage to generation circuits therefore described herein should only be limited in light of the claims that follow when taken in conjunction with the above description and accompanying drawings.

What is claimed is:

1. A reference voltage control circuit comprising:
    a source power supply selection unit configured to receive a first internal power supply voltage and a second internal power supply voltage, and select the first internal power supply voltage or the second internal power supply voltage as a source voltage in response to a test mode enable signal;
    a first reference voltage generation unit configured to receive the source voltage from the source power supply selection unit, and configured to generate a first low reference voltage and a first high reference voltage; and
    a second reference voltage generation unit configured to receive the first internal power supply voltage, and configured to generate a second low reference voltage and a second high reference voltage.

2. The reference voltage control circuit according to claim 1, wherein the voltage level of the first internal power supply voltage is altered in accordance with an operation mode of the reference voltage control circuit.

3. The reference voltage control circuit according to claim 1, wherein the second internal power supply voltage maintains substantially the same voltage level regardless of an operation mode of the reference voltage control circuit.

4. The reference voltage control circuit according to claim 1, wherein the source power supply selection unit comprises:
a first selection element configured to be driven in response to the test mode enable signal and configured to supply the first internal power supply voltage to an output node; and
a second selection element configured to be driven in response to an inverted signal of the test mode enable signal and configured to supply the second internal power supply voltage to the output node.

5. The reference voltage control circuit according to claim 4,
wherein the first reference voltage generation unit is electrically coupled between the output node of the source power supply selection unit and a ground terminal,
wherein the first reference voltage generation unit is configured to generate the first low reference voltage at substantially one third the voltage level of the source voltage, and
wherein the first reference voltage generation unit is configured to generate the first high reference voltage at substantially two thirds the voltage level of the source voltage.

6. The reference voltage control circuit according to claim 4,
wherein the second reference voltage generation unit includes a plurality of resistor elements electrically coupled in series between a terminal of the first internal power supply voltage and a ground terminal,
wherein the second reference voltage generation unit is configured to generate the second low reference voltage at substantially one third the voltage level of the first internal power supply voltage, and
wherein the second reference voltage generation unit is configured to generate the second high reference voltage at substantially two thirds the voltage level of the first internal power supply voltage.

7. The reference voltage control circuit according to claim 4, further comprising:
a first level control section electrically coupled between the first selection element and the output node; and
a second level control section electrically coupled between the second selection element and the output node.

8. The reference voltage control circuit according to claim 7, wherein the first level control section comprises a first resistor element and the second level control section comprises a second resistor element, and resistance values of the first and second resistor elements are configured such that a potential voltage level of the output node when the test mode enable signal is enabled and a potential voltage level of the output node when the test mode enable signal is disabled are substantially the same.

9. An internal voltage generation circuit comprising:
a first internal voltage driver configured to receive a first low reference voltage and a first high reference voltage, and configured to generate a first internal voltage; and
a second internal voltage driver configured to receive a second low reference voltage and a second high reference voltage, and configured to generate a second internal voltage,
wherein the first low reference voltage and the first high reference voltage are generated based on either a first internal power supply voltage or a second internal power supply voltage, and
wherein the second low reference voltage and the second high reference voltage are generated based on the first internal power supply voltage.

10. The internal voltage generation circuit according to claim 9, wherein the first internal voltage driver is configured to receive the first low reference voltage and the first high reference voltage which are generated based on the second internal power supply voltage, in response to a test mode enable signal, and the first internal voltage driver is configured to generate the first internal voltage.

11. The internal voltage generation circuit according to claim 10, wherein the first internal voltage is a cell plate voltage.

12. The internal voltage generation circuit according to claim 9, wherein the second internal voltage is a bit line precharge voltage.

13. A semiconductor memory apparatus comprising:
a reference voltage control circuit configured to generate a first low reference voltage and a first high reference voltage based on either a first internal power supply voltage or a second internal power supply voltage, and configured to generate a second low reference voltage and a second high reference voltage based on the first internal power supply voltage; and
an internal voltage generation circuit configured to generate a first internal voltage after receiving the first low reference voltage and the first high reference voltage, and configured to generate a second internal voltage after receiving the second low reference voltage and the second high reference voltage.

14. The semiconductor memory apparatus according to claim 13, wherein the reference voltage control circuit comprises:
a source power supply selection unit configured to receive the first internal power supply voltage and the second internal power supply voltage, and configured to select the first internal power supply voltage or the second internal power supply voltage as a source voltage in response to a test mode enable signal;
a first reference voltage generation unit configured to receive the source voltage, and configured to generate a first low reference voltage and a first high reference voltage; and
a second reference voltage generation unit configured to receive the first internal power supply voltage, and configured to generate a second low reference voltage and a second high reference voltage.

15. The semiconductor memory apparatus according to claim 14, wherein the voltage level of the first internal power supply voltage is altered in accordance with an operation mode of the reference voltage control circuit.

16. The semiconductor memory apparatus according to claim 14, wherein the second internal power supply voltage maintains substantially the same voltage level regardless of an operation mode of the reference voltage control circuit.

17. The semiconductor memory apparatus according to claim 14, wherein the source power supply selection unit comprises:

a first selection element configured to be driven in response to the test mode enable signal and configured to supply the first internal power supply voltage to an output node; and a second selection element configured to be driven in response to an inverted signal of the test mode enable signal and configured to supply the second internal power supply voltage to the output node.

18. The semiconductor memory apparatus according to claim 17, further comprising:

a first level control section electrically coupled between the first selection element and the output node; and a second level control section electrically coupled between the second selection element and the output node.

19. The semiconductor memory apparatus according to claim 18, wherein the first level control section comprises a first resistor element and the second level control section comprises a second resistor element, and resistance values of the first and second resistor elements are configured such that a potential voltage level of the output node when the test mode enable signal is enabled and a potential voltage level of the output node when the test mode enable signal is disabled are substantially the same.

* * * * *